United States Patent
Zhang et al.

(10) Patent No.: US 12,028,086 B2
(45) Date of Patent: Jul. 2, 2024

(54) SELF CALIBRATING DIGITAL-TO-ANALOG CONVERTER

(71) Applicant: NXP USA, INC., Austin, TX (US)

(72) Inventors: Yizhong Zhang, Suzhou (CN); Jie Jin, Suzhou (CN); Stefano Pietri, Austin, TX (US); Michael Todd Berens, Austin, TX (US); Hongyan Yao, Suzhou (CN); Jiawei Fu, Suzhou (CN)

(73) Assignee: NXP USA, Inc., Austin, TX (US)

( * ) Notice: Subject to any disclaimer, the term of this patent is extended or adjusted under 35 U.S.C. 154(b) by 160 days.

(21) Appl. No.: 17/819,092

(22) Filed: Aug. 11, 2022

(65) Prior Publication Data

US 2023/0066987 A1 Mar. 2, 2023

(30) Foreign Application Priority Data

Aug. 31, 2021 (CN) .......................... 202111008434.2

(51) Int. Cl.
*H03M 1/10* (2006.01)
*H03M 1/66* (2006.01)
(Continued)

(52) U.S. Cl.
CPC ............ *H03M 1/1057* (2013.01); *H03M 1/66* (2013.01); *H03M 1/687* (2013.01); *H03M 1/765* (2013.01); *H03M 1/785* (2013.01)

(58) Field of Classification Search
CPC ...... H03M 1/1057; H03M 1/66; H03M 1/687; H03M 1/765; H03M 1/785
(Continued)

(56) References Cited

U.S. PATENT DOCUMENTS 5,627,537 A 5/1997 Quinlan et al.
6,331,830 B1 12/2001 Song et al.
(Continued)

OTHER PUBLICATIONS

Xu, W., "Research of Segmented 8bit Voltage-Mode R-2R Ladder DAC", 2015 IEEE 11th International Conference on ASIC (ASICON), Nov. 3-6, 2015.

*Primary Examiner* — Khai M Nguyen

(57) ABSTRACT

A self-calibrating digital-to-analog converter (DAC) is disclosed. The self-calibrating DAC includes a DAC including a least significant bit (LSB) side resistor network and a most significant bit (MSB) side resistor network. At least the MSB side resistor network includes a plurality of trimmable resistors. A resistance to frequency converter coupled with an output of the DAC is included to generate a frequency $f_L$ based on a value of the LSB side resistor network or the MSB side resistor network. A monitor is included to generate a counter value by comparing $f_L$ with a high frequency clock having a constant frequency $f_H$. A memory is included to store at least two counter values generating by comparing $f_L$ and $f_H$ once when the LSB side resistor network is connected while the MSB side resistor network is floating and once when the LSB side resistor network is floating while only one of the resistors in the MSB side resistor network is connected and all other resistors in the MSB side resistor network are floating. A comparator is included to compare the at least two counter values. A trimming controller is included to generate a trimming signal to trim one of the plurality of trimmable resistors based on an output of the comparator.

15 Claims, 3 Drawing Sheets

(51) Int. Cl.
*H03M 1/68* (2006.01)
*H03M 1/76* (2006.01)
*H03M 1/78* (2006.01)

(58) Field of Classification Search
USPC .......................................... 341/120, 121, 145
See application file for complete search history.

(56) References Cited

U.S. PATENT DOCUMENTS

| | | | |
|---|---|---|---|
| RE38,083 E | 4/2003 | Ashe | |
| 6,633,246 B1 | 10/2003 | Bowers | |
| 7,468,686 B2 * | 12/2008 | Brubaker | H03M 1/1061 |
| | | | 341/145 |
| 8,581,766 B1 | 11/2013 | Li et al. | |
| 9,083,380 B2 | 7/2015 | Price et al. | |
| 10,014,877 B1 * | 7/2018 | Garg | H03M 1/68 |
| 2014/0266835 A1 | 9/2014 | Price et al. | |
| 2016/0056834 A1 | 2/2016 | Frank | |

* cited by examiner

SELF CALIBRATING DIGITAL-TO-ANALOG CONVERTER

CROSS-REFERENCE TO RELATED APPLICATIONS

This application claims the priority under 35 U.S.C. § 119 of China application no. 202111008434.2, filed on 31 Aug. 2021, the contents of which are incorporated by reference herein.

BACKGROUND

A digital-to-analog converter (DAC) is a circuit that converts a digital signal into an analog signal. An analog-to-digital converter (ADC) performs the reverse function. There are several DAC architectures; the suitability of a DAC for a particular application is determined by figures of merit including: resolution, maximum sampling frequency and others. In principle, a digital signal is inputted to a DAC and the DAC outputs an accurate output voltage. In reality, the accuracy of the output voltage is subject to gain, offset and nonlinear errors from the DAC and other components in the signal chain. The DAC circuit should compensate for these errors in order to get an accurate output voltage. This error correction can be implemented with external components and post-manufacture trimming. Digital calibration modifies the input sent to the DAC such that the gain, offset and nonlinear errors are taken into account thus removing the need for external components and trimming. Modern systems require high accuracy of digital to analog conversion. DAC is typically implemented using resistor networks. For higher accuracy, the resistors should match. However, due to factors such as process variations, it is difficult to fabricate substantially matching resistors. A high accuracy precision DAC is typically used to fine-tune gain and offset, and minimizes other non-linearity. Therefore, it becomes the precision DAC that makes a signal precise as the DAC calibrates the signal. Similar to any analog circuit, there are many non-idealities associated with DACs. The main source of direct-current (DC) errors in a DAC are offset error (OE), gain (GE), and integral non-linearity (INL).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a self-calibrating digital-to-analog converter (DAC) is disclosed. The self-calibrating DAC includes a DAC including a least significant bit (LSB) side resistor network and a most significant bit (MSB) side resistor network. At least the MSB side resistor network includes a plurality of trimmable resistors. A resistance to frequency converter coupled with an output of the DAC is included to generate a frequency $f_L$ based on a value of the LSB side resistor network or the MSB side resistor network. A monitor is included to generate a counter value by comparing $f_L$ with a high frequency clock having a constant frequency $f_H$. A memory is included to store at least two counter values generating by comparing $f_L$ and $f_H$ once when the LSB side resistor network is connected while the MSB side resistor network is floating and once when the LSB side resistor network is floating while only one of the resistors in the MSB side resistor network is connected and all other resistors in the MSB side resistor network are floating. A comparator is included to compare the at least two counter values. A trimming controller is included to generate a trimming signal to trim one of the plurality of trimmable resistors based on an output of the comparator.

In some examples, the self-calibrating DAC further includes a one-hot decoder to convert input MSB bits to a decoded output in which only one bit is high. The one-hot decoder is configured to be used only during the calibration mode. A unary or thermometer decoder is configured to be used during a normal mode of operation of the DAC. The resistance to frequency converter including a resonance circuit that is configured to use a resistance of the LSB side resistor network or the MSB side resistor network to generate the frequency $f_L$ corresponding to a connected resistance value of the LSB side resistor network or the MSB side resistor network. The monitor is configured to generate the first counter value by comparing $f_L$ with $f_H$ when resistors of the LSB side resistor network are electrically connected to the LSB input bits and resistors of the MSB side resistor network are floating. The monitor is further configured to generate a second counter value by comparing $f_L$ with $f_H$ when the resistors of the LSB side resistor network are floating and only one resistor of the MSB side resistor network is electrically connected with the MSB side input bits using a one-hot decoder on MSB side. The comparator is configured to compare the first counter value with the second counter value to generate an up or down signal. The trimming controller is configured to continuously generate a trimming signal to trim the only one resistor of the MSB side resistor network and to generate a new second counter value after each trimming step until the new counter value is equal to or within a predefined range from the first counter value.

In another example, a method for self-calibrating a digital-to-analog converter (DAC) including a least significant bit (LSB) side resistor network and a most significant bit (MSB) side resistor network, is disclosed. The method includes (a) electrically connecting resistors in the LSB side resistor network with LSB segment of an digital input signal, (b) electrically disconnecting resistors in the MSB side resistor network from MSB segment of the digital input signal, (c) generating a low frequency signal corresponding to a resistance of the LSB side resistor network, (d) calculating a first counter value by comparing the low frequency signal with a constant high frequency signal and storing the first counter value, (e) disconnecting the LSB side resistor network and connecting only one resistor of the MSB side resistor network using a one-hot decoder that outputs a code with only one high bit, (f) generating the low frequency signal corresponding to a resistance of the MSB side resistor network, (g) calculating a second counter value by comparing the low frequency signal with the constant high frequency signal and storing the second counter value and (h) generating a trimming signal to trim the only one resistor of the MSB side resistor network based on a comparison of the first counter value and the second counter value.

In some examples, step (h) is repeated until the second counter value becomes equal to the first counter value or comes within a predefined range from the first counter value. The method further includes repeating step (e) by connecting a next only one resistor in the MSB side resistor network and floating all other resistors in the MSB side resistor network. Steps (f) to (h) may be repeated for other resistors in the MSB side resistor network, one by one. The low frequency signal is generated using a resonance network that uses a connected resistance of either the LSB side resistor network or a resistance of one resistor in the MSB side resistor network selected by an output of the one-hot decoder. In some embodiments, the frequency of the constant high frequency signal is at least 100 times the frequency of the low frequency signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
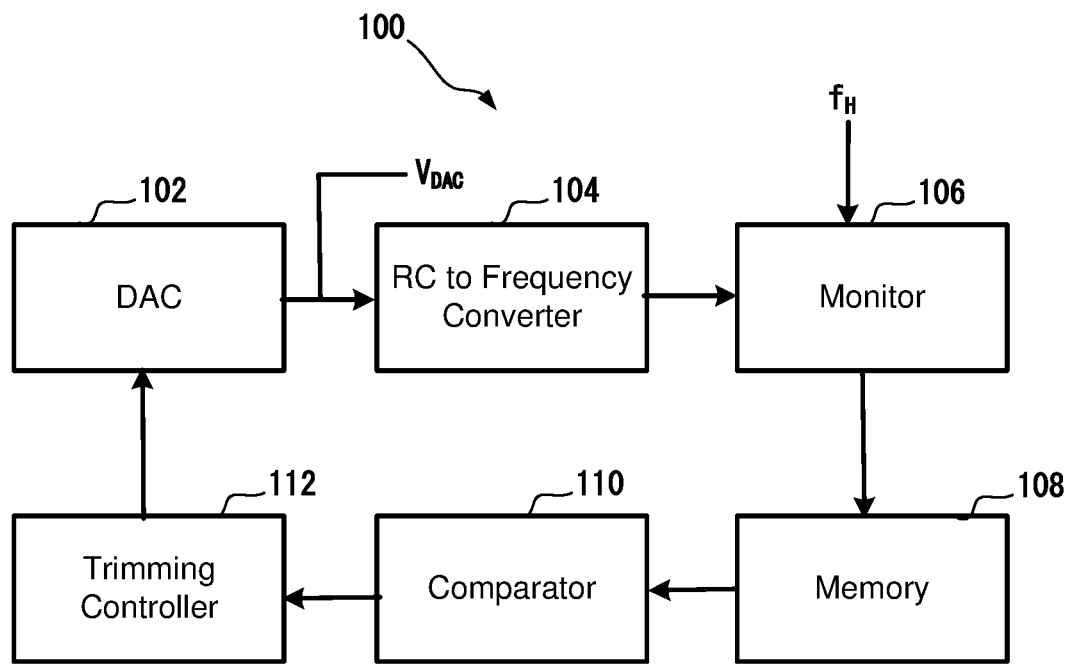
FIG. 1 depicts a Digital to Analog Converter (DAC) calibration system in accordance with one or more embodiments of the present disclosure.

Note that figures are not drawn to scale. Not all components of the improved ground switch are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

A precision transmitter/receiver system typically includes high-resolution digital-to-analog converters (DAC) and analog-to-digital converters (ADC). For example, in industrial input/output applications, it's becoming more demanding to have a ~16-bit accurate transmitting path and a greater than 20-bit accurate receiving path integrated in a single-chip solution. The most common DAC architectures are R string- or R2R ladder-based topologies. In some examples, both topologies may be used in a DAC. For example, R2R ladder may be used to implement least significant bits and R string topology may be used for most significant bits. The biggest contributor to integral non-linearity (INL) for these DACs is mismatches in resistors used in ladder and string formats. INL refers to the deviation between the ideal output of a DAC and the actual output of a DAC. Many analog processes include a high-precision resistor to design ladders and string. As the demand for higher accuracy keeps increasing, having a high-precision resistor is insufficient. To address this concern, additional design, layout, and trimming techniques are being employed to counter the effect of these mismatches in resistors.

The embodiments described herein uses RC to frequency conversion to derive a counter value for a selected most significant bit (MSB) resistor in the DAC resistor network and trimming the selected resistor based on a comparison of a counter value derived from least significant bit (LSB) resister network. Typically, an on-chip analog to digital converter (ADC) is required for the calibration of a DAC. However, the embodiments described here do not need an ADC for the calibration of the DAC. Thus, the calibration system described herein may result in a smaller die size. The embodiments described herein uses frequency to detect unit resistance variations. Using trimmable resistors, these variations are corrected and the resistors are matched.

FIG. 1 a Digital to Analog Converter (DAC) calibration system 100. The DAC calibration system includes a DAC 102 that includes a resistor network. At least some of the resistors in the resistor network are trimmable. A RC (resistor-capacitor) to frequency converter 104 is included to generate a signal with a frequency $f_L$. A monitor 106 is included to derive a counter value by comparing the signal with frequency $f_L$ with a higher frequency signal with frequency $f_H$. In some example, the monitor 106 may include a frequency divider circuit to divide $f_H$ by $f_L$ to derive a counter value. The higher frequency signal may be the on-chip clock signal. In some examples, a local higher frequency signal may be generated to be used for the DAC calibration. The frequency $f_H$ needs to be substantially higher than the frequency $f_L$. A higher value of $f_H$ will provide a better accuracy of calibration due to increased granularity. In some examples, $f_L$ may be in KHz range while $f_H$ may be in MHz.

The DAC calibration system 100 may be fabricated along with the DAC 102 on a same chip. The DAC calibration system 100 further includes a memory 108. The memory 108 may be a temporary or a permanent memory (e.g., a volatile or a non-volatile memory). A non-volatile memory is the memory that retains the stored data between the power on cycles. The memory 108 is used for storing counter values generated by the monitor 106. A comparator 110 is included to compare the stored counter values. The output of the comparator 110 is inputted to a trimming controller 112. The input to the trimming controller 112 may be an up or down signal. The trimming controller 112 generates a trimming signal to vary the resistance of a resistor in the resistor network of the DAC. The calibration process may be performed at the power on event, at the first power on, at configurable intervals or the calibration process may be triggered from an external system. $V_{DAC}$ represents the analog output of the DAC 102. In some examples, there may be a switch at the DAC output. The switch may be turned off by a calibration active signal, that is, the DAC output may be disabled during the calibration mode.

In some examples, MSB and LSB bits may not be equal. Assuming for example, LSB=N bits and MSB=M bits. Ideally, the resistance of the LSB segment $R_{LSB\_eq}$ when all LSB resistors are electrically connected to the digital input lines should be equal to the value of each of the MSB resistors. However, it may be difficult to achieve this equivalence due factors such as process variations. The resistance mismatch in the order of $1/2^N$ or $1/2^{N+1}$ may be permissible. However, the fabrication process may not guarantee a mismatch smaller than the permissible values, especially when the value of N is higher.

Figure 2:
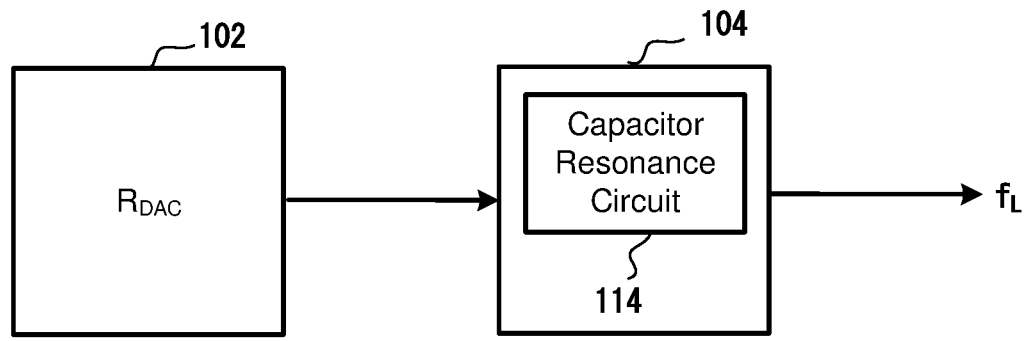
FIG. 2 depicts a RC (resistor-capacitor) to frequency converter in accordance with one or more embodiments of the present disclosure.

FIG. 2 shows the RC to frequency converter 104 that includes a capacitor resonance circuit 114 including one or more capacitors. The resistance of DAC ($R_{DAC}$) when coupled with the capacitor of the capacitor resonance circuit 114 may form a RC resonance (in combination with parasitic inductance or additional inductance that may be included in the RC to frequency converter 104) circuit to generate frequency $f_L$ corresponding to $R_{DAC}$. The frequency $f_H$ changes with the changes in $R_{DAC}$. Hence, a resistance variation may be detected by measuring $f_H$ (e.g., by dividing $f_H$ by $f_L$ to derive a counter value).

Figures 3, 4:
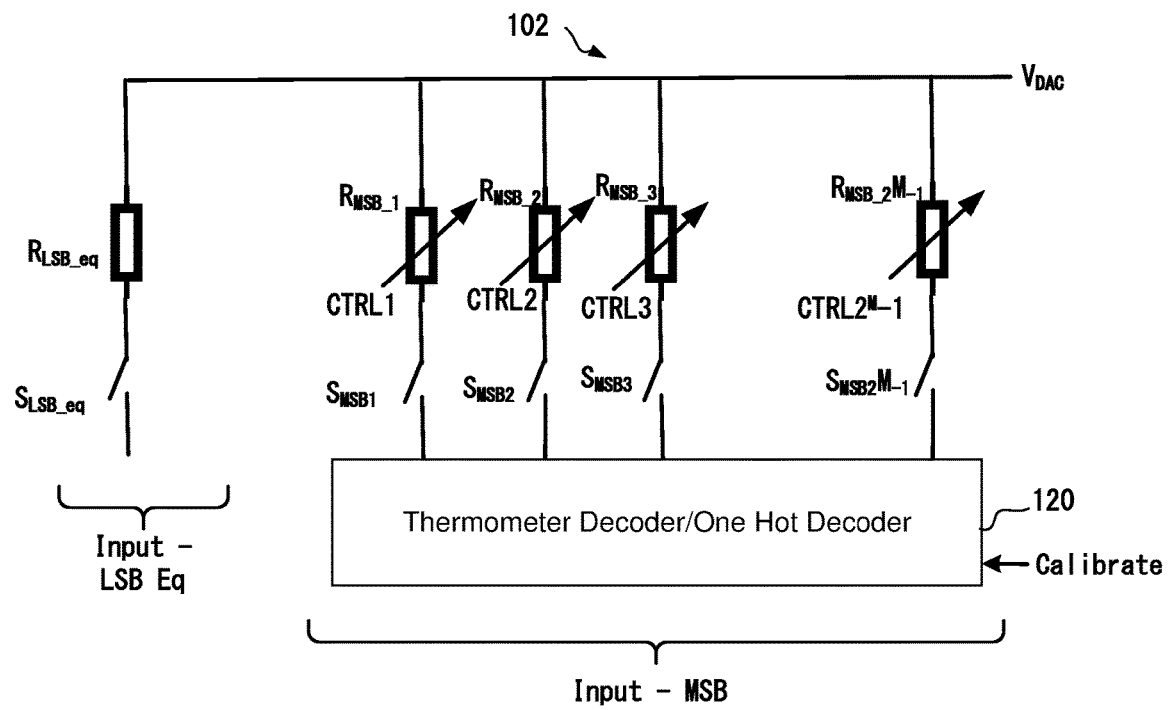
FIG. 3 shows an internal structure of the DAC configured for self-calibration in accordance with one or more embodiments of the present disclosure.
FIG. 4 shows a decoder table showing two different type of decoder outputs for an input digital signal in accordance with one or more embodiments of the present disclosure.

FIG. 3 shows an internal resistor network representation of the DAC 102. As shown, the resistance of the LSB lines when switches $S_{LSB}$s are ON thus $R_{LSB}$s are coupled with the LSB inputs is represented as $R_{LSB\_eq}$ and the switches $S_{LSB}$s are represented as $S_{LSB\_eq}$ as if there is only one LSB bit. A binary or unary decoder may be used at LSB input side. On the MSB input side, the MSB inputs are coupled with a unary and one-hot decoder 120. The unary or thermometer decoder may be used during the normal operational mode of the DAC when the calibrate signal is not active and a one-hot decoder may be used during the calibration mode when the calibrate signal is active. One-hot decoder is a circuit that, for a given input digital signal, outputs a digital code in which only one bit is 1 in the entire word. The unary or thermometer decoder may output an increasing digital output.

In some implementations, such as in R string implementation, the MSB side input lines may include $2^M$ number of resisters where M is the width of the MSB segment of the input digital signal. Table 150 of FIG. 4 shows example values of the output of a thermometer decoder and a one-hot decoder for a three MSB bit input signal. Note that, three MSB bit signal is selected only for the purpose explanation in that the usage of the DAC calibration system 100 are not limited to three bit input signals. The MSB side resistor network may include trimmable resistors $R_{MSB\_1}$ to $R_{MSB\_2^M-1}$. The resistors $R_{MSB\_1}$ to $R_{MSB\_2^M-1}$ are configured to be trimmed by control signals CTRL1 to CTRL$2^M-1$ respectively. The control signals are generated by the trimming controller 112 based on the input from the comparator 110. The resistor network includes switches $S_{MSB1}$ to $S_{MSB2^M-1}$.

During the calibration mode, in some examples, the switches $S_{MSB1}$ to $S_{MSB2^M-1}$ are turned off to float the MSB side resistors $R_{MSB\_1}$ to $R_{MSB\_2^M-1}$ and the switch $S_{LSB\_eq}$ is turned on (i.e., the LSB side resistors are electrically connected to the LSB input bits, in some example through a decoder). The RC to frequency converter 104 generate a signal having a frequency $f_L$ that is a function of the resistance $R_{LSB\_eq}$. A first counter value is calculated by the monitor 106 using a high frequency clock of frequency $f_H$. The first counter value is stored in the memory 108. Subsequently, the switch $S_{LSB\_eq}$ is turned off (thus floating the LSB side resistors) and the output of the one-hot decoder is applied to the MSB side input lines. Because the output of the one-hot decoder includes only one high bit, only one of the switches $S_{MSB1}$ to $S_{MSB2^M-1}$ is on at a time. The frequency fL is measured by the monitor 106 as described above and a second counter value is calculated. The second counter value is stored in the memory 108. The comparator 110 compares the first counter value and the second counter value and generates CTRLx (x=1 to $2^M-1$) to trim the resistor $R_{MSB\_x}$ and the second counter value may be generated again based on the trimmed $R_{MSB\_x}$. The trimming loop may continue until the second counter value comes within a preconfigured threshold near the first counter value. The degree of closeness of the second counter value to the first counter value is proportional to the accuracy of the DAC 102. The x may start at 1 or at $2^M-1$ or any arbitrary bit and may go up or down from the starting point depending on the starting point. The calculation of the second counter value and trimming of the $R_{MSB\_x}$ may be repeated for all MSB bits by changing the input signal as depicted in the table 150 of FIG. 4.

Figure 5:
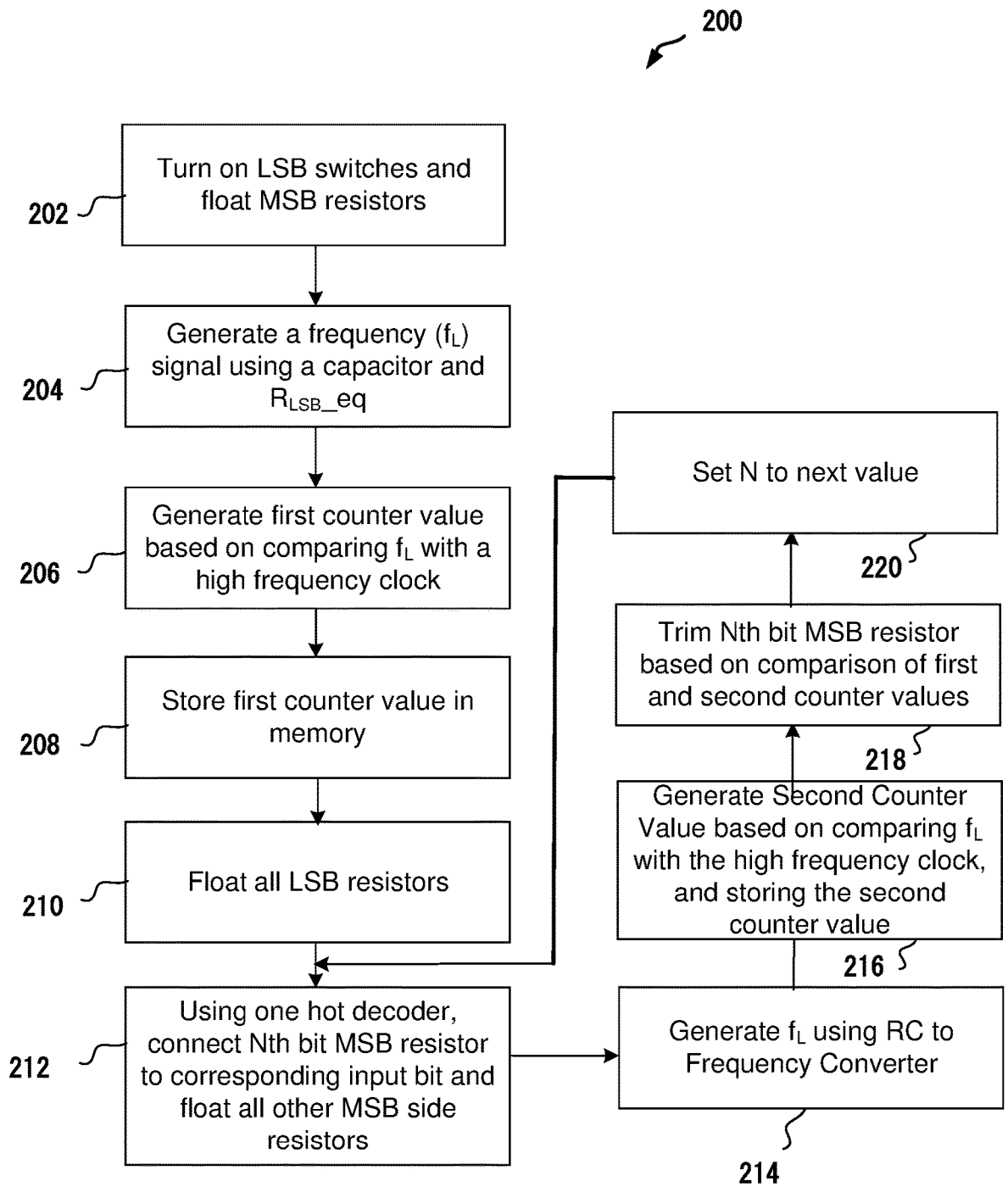
FIG. 5 depicts a flow chart of a method for DAC self-calibration in accordance with one or more embodiments of the present disclosure.

FIG. 5 depicts a flow chart of a method 200 for DAC self-calibration. Accordingly, at step 202, the LSB side resistors are electrically connected to the LSB input bits and the MSB side resistors are floated by electrically disconnecting the MSB side resistors from the MSB input bits. At step 204, based on the combined resistance of the LSB side resistors, the signal of frequency $f_L$ is generated by the RC to frequency converter 104. In some embodiments, a terminal resistor may be coupled with the LSB side resistor network and the terminal resistor is electrically coupled with the LSB side resistors only during the calibration mode and $R_{LSB\_eq}$ includes the value of the terminal resistor. The frequency $f_L$ is a function of the value of the connected resistance with the capacitance of the RC to frequency converter 104. At step 206, a first counter value is calculated, in one example, by dividing a constant high frequency $f_H$ signal that may be an on chip clock signal. At step 208, the first counter value is stored in a volatile or non-volatile memory. At step 210, the LSB side resistors (and the terminal resistor, if present) are floated by electrically disconnecting the LSB side resistors from the LSB input bit(s). At step 212, using the one-hot decoder, connecting Nth bit MSB resistor to the corresponding input bit line and floating all other MSB side resistors. At step 214, generate the frequency $f_L$ using the RC to frequency converter 104. At step 216, a second counter value is calculated, for example, by dividing $f_H$ by $f_L$. and similar to the first counter value, the second counter value is stored in the memory 108 At step 218, the first counter value and the second counter value are compared by the comparator 110 that may output an up or down signal based on the comparison of the two values. Based on the output of the comparator 110, the trimming controller 112 generates a control signal CTRL1 . . . $CTRL^{M}-1$ to trim the MSB resistor. The trimming loop for the MSB resistor may continue to loop till the second counter value comes within a predefined range from the first counter value. At step 220, using the next output of the one-hot decoder, a next MSB resistor is selected to be trimmed and steps 212 to 220 are repeated until all MSB side resisters are trimmed.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A self-calibrating digital-to-analog converter (DAC), comprising:
    a DAC including a least significant bit (LSB) side resistor network and a most significant bit (MSB) side resistor network, wherein at least the MSB side resistor network includes a plurality of trimmable resistors;
    a resistance to frequency converter coupled with an output of the DAC to generate a frequency $f_L$ based on a value of the LSB side resistor network or the MSB side resistor network;
    a monitor to generate a counter value by comparing $f_L$ with a high frequency clock having a constant frequency $f_H$;
    a memory to store at least two counter values;
    a comparator to compare the at least two counter values; and
    a trimming controller to generate a trimming signal to trim one of the plurality of trimmable resistors based on an output of the comparator.

2. The self-calibrating DAC of claim 1, further including a one-hot decoder to convert input MSB bits to a decoded output in which only one bit is high.

3. The self-calibrating DAC of claim 2, wherein the one-hot decoder is configured to be used only during the calibration mode.

4. The self-calibrating DAC of claim 3, wherein a unary or thermometer decoder is configured to be used during a normal mode of operation of the DAC.

5. The self-calibrating DAC of claim 1, wherein the resistance to frequency converter including a resonance circuit that is configured to use a resistance of the LSB side resistor network or the MSB side resistor network to generate the frequency $f_L$ corresponding to a connected resistance value of the LSB side resistor network or the MSB side resistor network.

6. The self-calibrating DAC of claim 5, wherein the monitor is configured to generate the first counter value by comparing $f_L$ with $f_H$ when resistors of the LSB side resistor network are electrically connected to the LSB input bits and resistors of the MSB side resistor network are floating.

7. The self-calibrating DAC of claim 6, wherein the monitor is further configured to generate a second counter value by comparing $f_L$ with $f_H$ when the resistors of the LSB side resistor network are floating and only one resistor of the MSB side resistor network is electrically connected with the MSB side input bits using a one-hot decoder on MSB side.

8. The self-calibrating DAC of claim 7, wherein the comparator is configured to compare the first counter value with the second counter value to generate an up or down signal.

9. The self-calibrating DAC of claim 8, wherein the trimming controller is configured to continuously generate a trimming signal to trim the only one resistor of the MSB side resistor network and to generate a new second counter value after each trimming step until the new counter value is equal to or within a predefined range from the first counter value.

10. A method for self-calibrating a digital-to-analog converter (DAC) including a least significant bit (LSB) side resistor network and a most significant bit (MSB) side resistor network, the method comprising:
   (a) electrically connecting resistors in the LSB side resistor network with LSB segment of a digital input signal;
   (b) electrically disconnecting resistors in the MSB side resistor network from MSB segment of the digital input signal;
   (c) generating a low frequency signal corresponding to a resistance of the LSB side resistor network;
   (d) calculating a first counter value by comparing the low frequency signal with a constant high frequency signal and storing the first counter value;
   (e) disconnecting the LSB side resistor network and connecting only one resistor of the MSB side resistor network using a one-hot decoder that outputs a code with only one high bit;
   (f) generating the low frequency signal corresponding to a resistance of the MSB side resistor network;
   (g) calculating a second counter value by comparing the low frequency signal with the constant high frequency signal and storing the second counter value; and
   (h) generating a trimming signal to trim the only one resistor of the MSB side resistor network based on a comparison of the first counter value and the second counter value.

11. The method of claim 10, wherein step (h) is repeated until the second counter value becomes equal to the first counter value or comes within a predefined range from the first counter value.

12. The method of claim 10, further including repeating step (e) by connecting a next only one resistor in the MSB side resistor network and floating all other resistors in the MSB side resistor network.

13. The method of claim 12, further including performing steps (f) to (h).

14. The method of claim 10, wherein the low frequency signal is generated using a resonance network that uses a connected resistance of either the LSB side resistor network or a resistance of one resistor in the MSB side resistor network selected by an output of the one-hot decoder.

15. The method of claim 10, wherein frequency of the constant high frequency signal is at least 100 times frequency of the low frequency signal.

* * * * *